United States Patent
Mazed et al.

(10) Patent No.: US 9,558,779 B2
(45) Date of Patent: Jan. 31, 2017

(54) SYSTEM ON CHIP (SOC) BASED ON PHASE TRANSITION AND/OR PHASE CHANGE MATERIAL

(71) Applicants: Mohammad A Mazed, Yorba Linda, CA (US); Rex Wiig, Chino, CA (US); Angel Martinez, Anaheim, CA (US)

(72) Inventors: Mohammad A Mazed, Yorba Linda, CA (US); Rex Wiig, Chino, CA (US); Angel Martinez, Anaheim, CA (US)

(*) Notice: Subject to any disclaimer, the term of this patent is extended or adjusted under 35 U.S.C. 154(b) by 0 days.

(21) Appl. No.: 14/757,373

(22) Filed: Dec. 22, 2015

(65) Prior Publication Data

US 2016/0181322 A1   Jun. 23, 2016

Related U.S. Application Data

(60) Provisional application No. 62/124,613, filed on Dec. 22, 2014.

(51) Int. Cl.
 *G02B 6/12*  (2006.01)
 *B82Y 20/00*  (2011.01)
 *G11B 7/2433*  (2013.01)

(52) U.S. Cl.
 CPC ........... *G11B 7/2433* (2013.01); *B82Y 20/00* (2013.01); *G02B 6/12004* (2013.01)

(58) Field of Classification Search
 CPC .. H01L 27/2436; H01L 27/0207; H01L 27/27; H01L 45/1213; H01L 45/144; H01L 45/06; H01L 45/2436; G02B 6/12004; G02B 6/12028; G02B 6/02204; B82Y 20/00; B82Y 10/00
 See application file for complete search history.

(56) References Cited

U.S. PATENT DOCUMENTS

| | | | | |
|---|---|---|---|---|
| 5,555,219 | A * | 9/1996 | Akiyama | C04B 35/26 252/299.01 |
| 6,154,326 | A * | 11/2000 | Ueyanagi | B82Y 10/00 359/819 |
| 2007/0183189 | A1* | 8/2007 | Nirschl | B82Y 10/00 365/163 |
| 2010/0198574 | A1* | 8/2010 | Veller | G06F 17/5022 703/14 |

* cited by examiner

Primary Examiner — Nikolay Yushin

(57) ABSTRACT

System on chips (SoCs) of a microprocessor electrically connected with electronic memory devices and/or optically connected with a optical memory device are disclosed along with various embodiments of building block of the microprocessor and the electronic memory devices, wherein the microprocessor can comprise digital unit and/or neural networks based unit.

20 Claims, 10 Drawing Sheets

SYSTEM ON CHIP (SOC) BASED ON PHASE TRANSITION AND/OR PHASE CHANGE MATERIAL

CROSS REFERENCE OF RELATED APPLICATION

This application is based upon and claims the benefit of priority from U.S. Provisional Patent Application No. 62/124,613 ("the '613 provisional patent application") entitled, "VANADIUM OXIDE ELECTRONIC MEMORY DEVICE" filed on Dec. 22, 2014. The contents of the '613 provisional patent application is incorporated herein by reference in its entirety as though fully set forth.

FIELD OF THE INVENTION

Technologies to replace today's microprocessor and memory device for greater speed, higher density and higher efficiency are critically needed in the computing marketplace.

The present invention generally relates to a system on chip (SoC) based on phase transition material and/or phase change material, along with various embodiments of a microprocessor.

SUMMARY OF THE INVENTION

A first system on chip-a microprocessor electrically connecting with electronic memory devices and various embodiments of an electronic memory device are disclosed.

A second system on chip-a microprocessor optically connecting with an optical memory device is disclosed.

A third system on chip-a microprocessor optically connecting with an optical memory device and also electrically connecting with memory devices is disclosed.

DETAIL DESCRIPTION OF THE DRAWINGS

Figure 1:
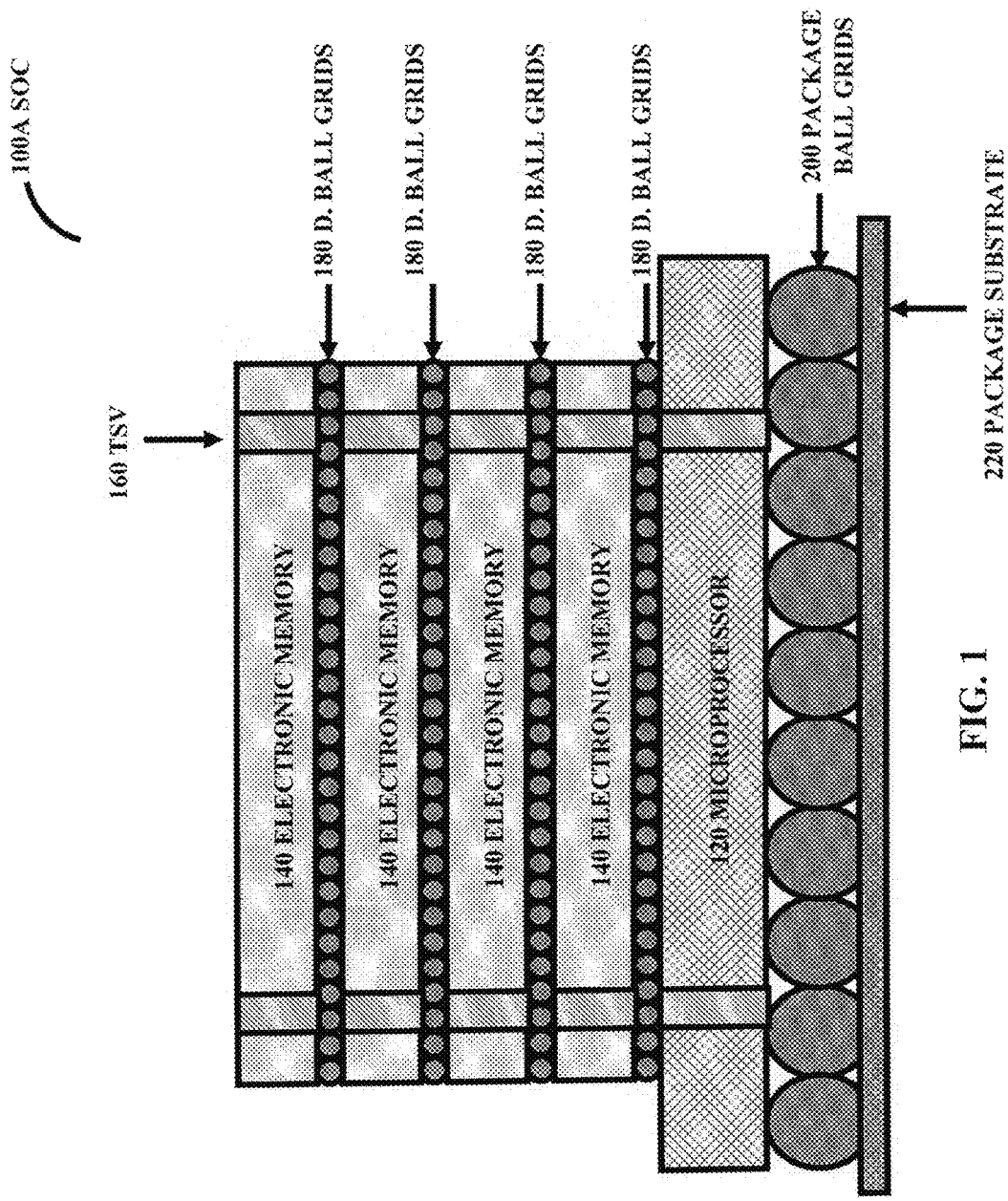
FIG. 1 illustrates an embodiment of a first system on chip-a microprocessor electrically connecting with electronic memory devices.

FIG. 1 illustrates an embodiment of 100A-a first system on chip.

In FIG. 1 120, a microprocessor, which is electrically connected with 140, an electronic memory device(s) through 160, a metallized semiconductor via hole (TSV). Device ball grids (for electrically connecting 140, the electronic memory devices with 120, the microprocessor) is denoted by 180. Package ball grids (for electrically connecting 120, the microprocessor to 220, a package substrate) is denoted by 200.

Figure 2:
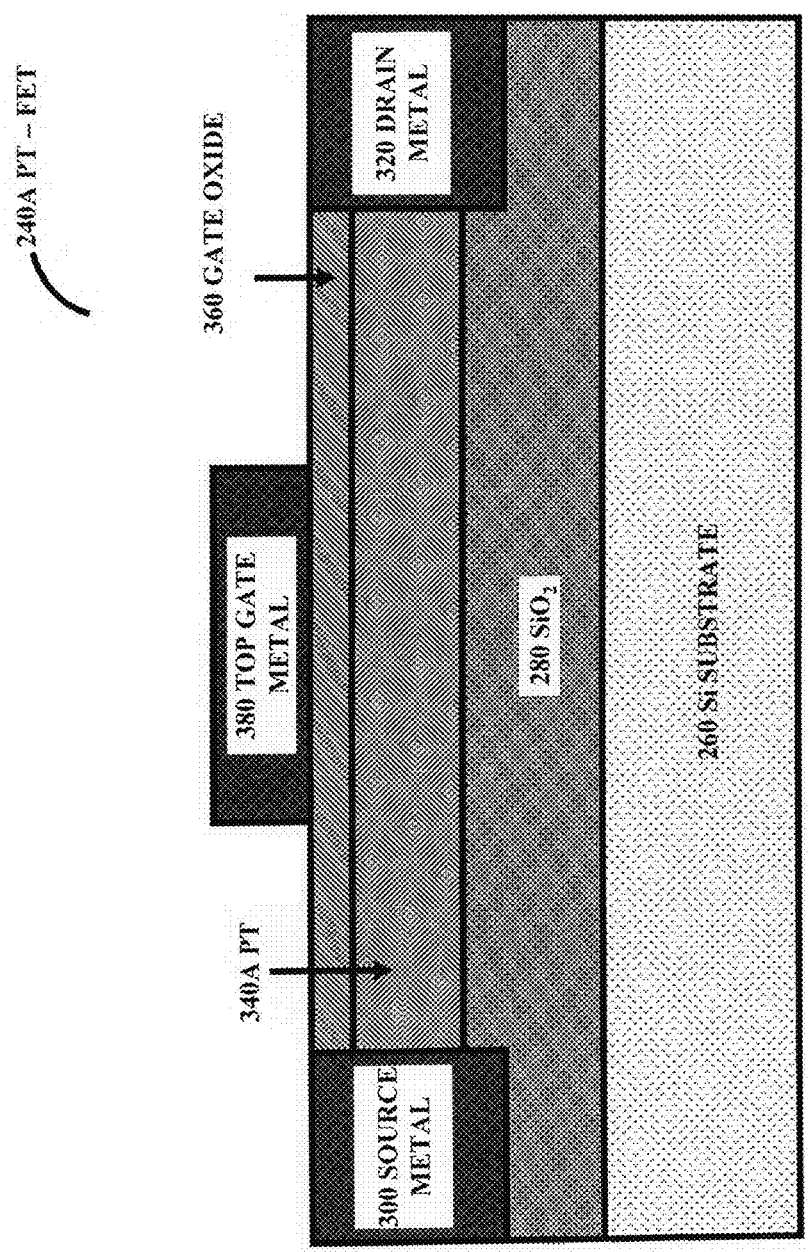
FIG. 2 illustrates an embodiment of a building block of the microprocessor.
Figure 3:
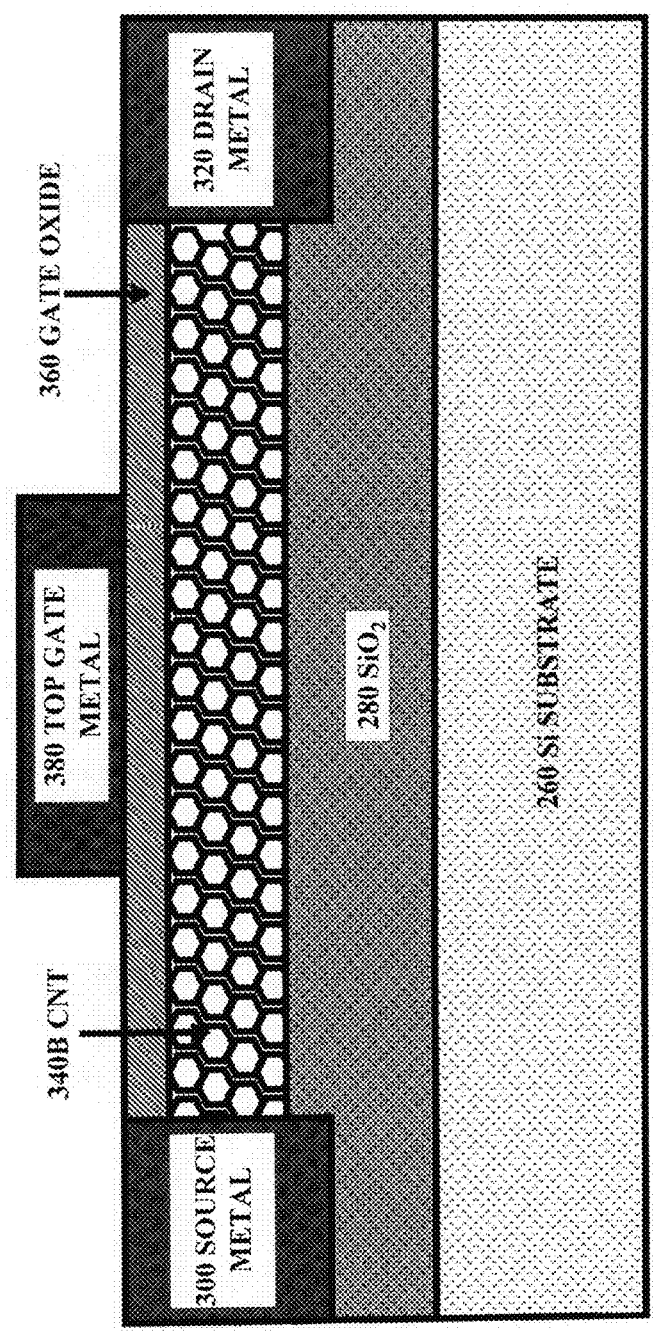
FIG. 3 illustrates another embodiment of a building block of the microprocessor.
Figure 4:
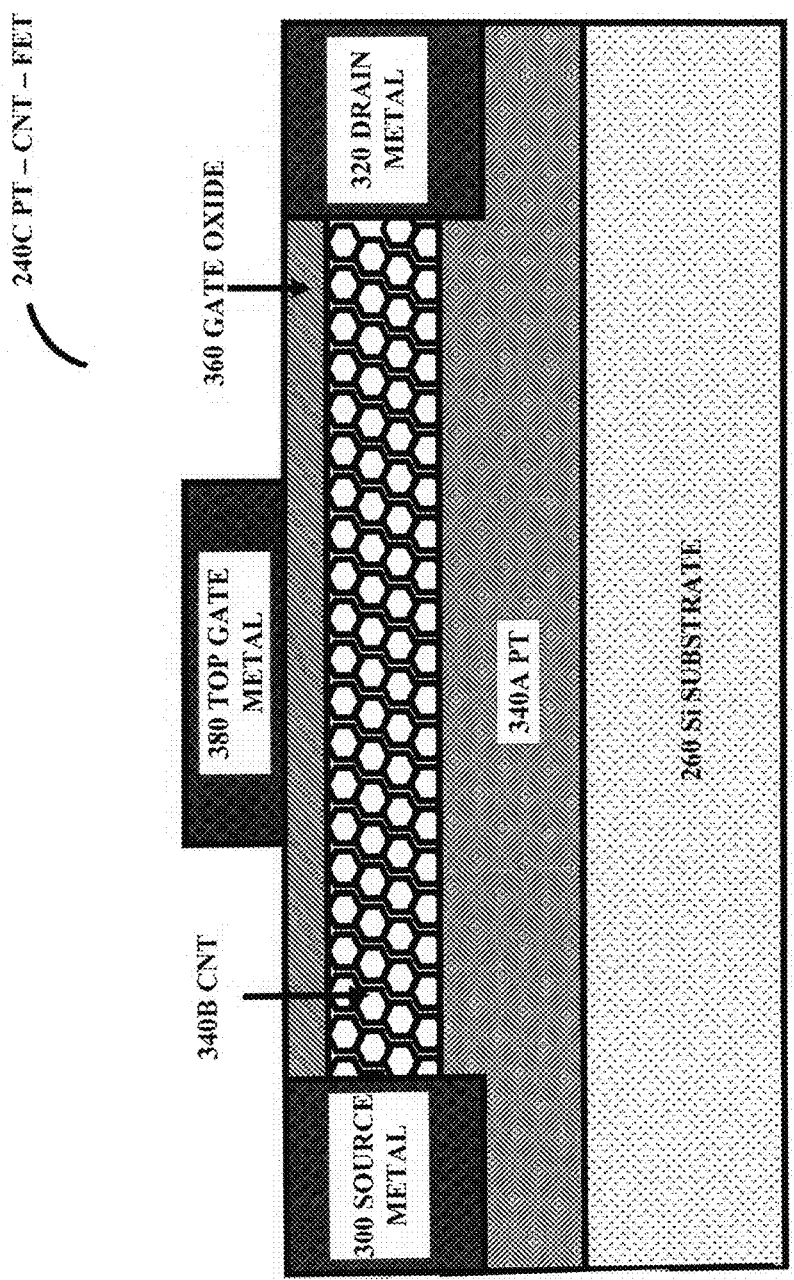
FIG. 4 illustrates another embodiment of a building block of the microprocessor.

FIGS. 2-4 illustrate various embodiments of a building block of 120, the microprocessor. The building block of 120, the microprocessor can be a field effect transistor (FET).

FIG. 2 illustrates 240A, a phase transition material (PT) based field effect transistor. In FIG. 2 silicon substrate is denoted by 260, silicon dioxide dielectric is denoted by 280, source metal is denoted by 300, drain metal is denoted by 320, phase transition material is denoted by 340A, gate oxide (e.g., hafnium oxide) is denoted by 360 and gate metal is denoted by 380.

FIG. 3 illustrates 240B, carbon nanotube (CNT) based field effect transistor. In FIG. 3 silicon substrate is denoted by 260, silicon dioxide dielectric is denoted by 280, source metal is denoted by 300, drain metal is denoted by 320, carbon nanotube is denoted by 340B, gate oxide is denoted by 360 and gate metal is denoted by 380. 340B, the carbon nanotube can be metallurgically connected/welded utilizing a metal layer.

FIG. 4 illustrates 240C, a hybrid phase transition material-carbon nanotube (PT-CNT) based field effect transistor. In FIG. 4 silicon substrate is denoted by 260, silicon dioxide dielectric is denoted by 280, source metal is denoted by 300, drain metal is denoted by 320, phase transition material is denoted by 340A, carbon nanotube is denoted by 340B, gate oxide is denoted by 360 and gate metal is denoted by 380. 340B, the carbon nanotube can be metallurgically connected/welded utilizing a metal layer.

Many types of electronic memory devices (e.g., Dynamic Random Access Memory (DRAM) and NAND Flash) are used in present computing systems. Dynamic Random Access Memory (DRAM) is an electronic volatile memory device that stores each bit of data in a separate capacitor. The capacitor can be either charged or discharged; these two states are taken to represent the two values of a bit, conventionally called 0 and 1. The capacitor will slowly discharge and the data eventually fades, unless the capacitor charge is refreshed periodically. NAND flash memory device is an electronic non-volatile memory device that can be electrically erased and reprogrammed.

Present invention of an electronic memory device based on phase transition material (e.g., vanadium dioxide ($VO_2$), which can replace NAND flash electronic memory device.

Figure 5:
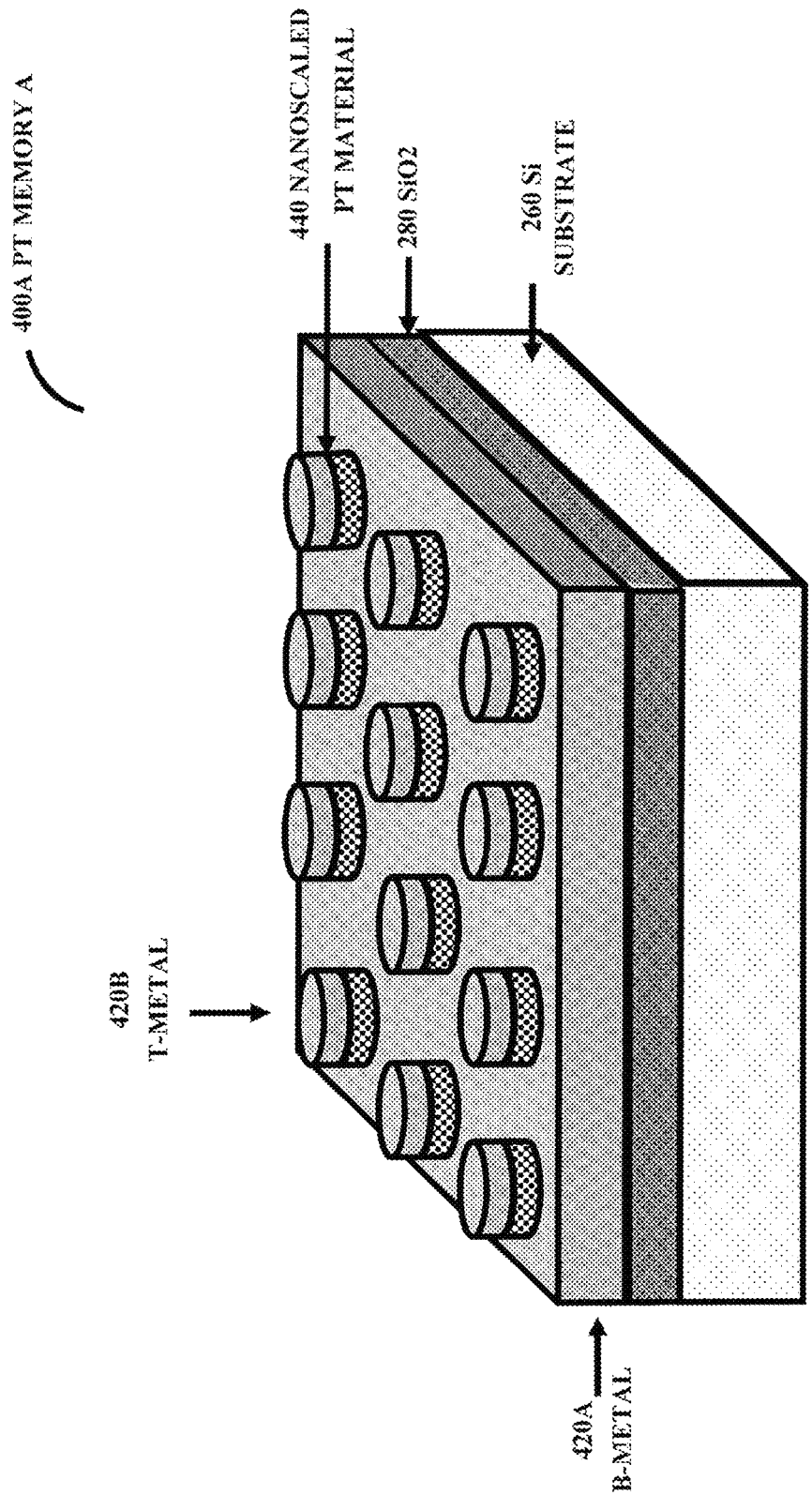
FIG. 5 illustrates an embodiment of an electronic memory device.

FIG. 5 illustrates an embodiment of a cross-sectional design of a cell of 400A, an electronic memory device based on nanoscaled phase transition material. In FIG. 5 silicon substrate is denoted by 260, silicon dioxide dielectric is denoted by 280, bottom metal is denoted by 420A, nanoscaled phase transition material is denoted by 440 and top metal is denoted by 420B.

Figure 6:
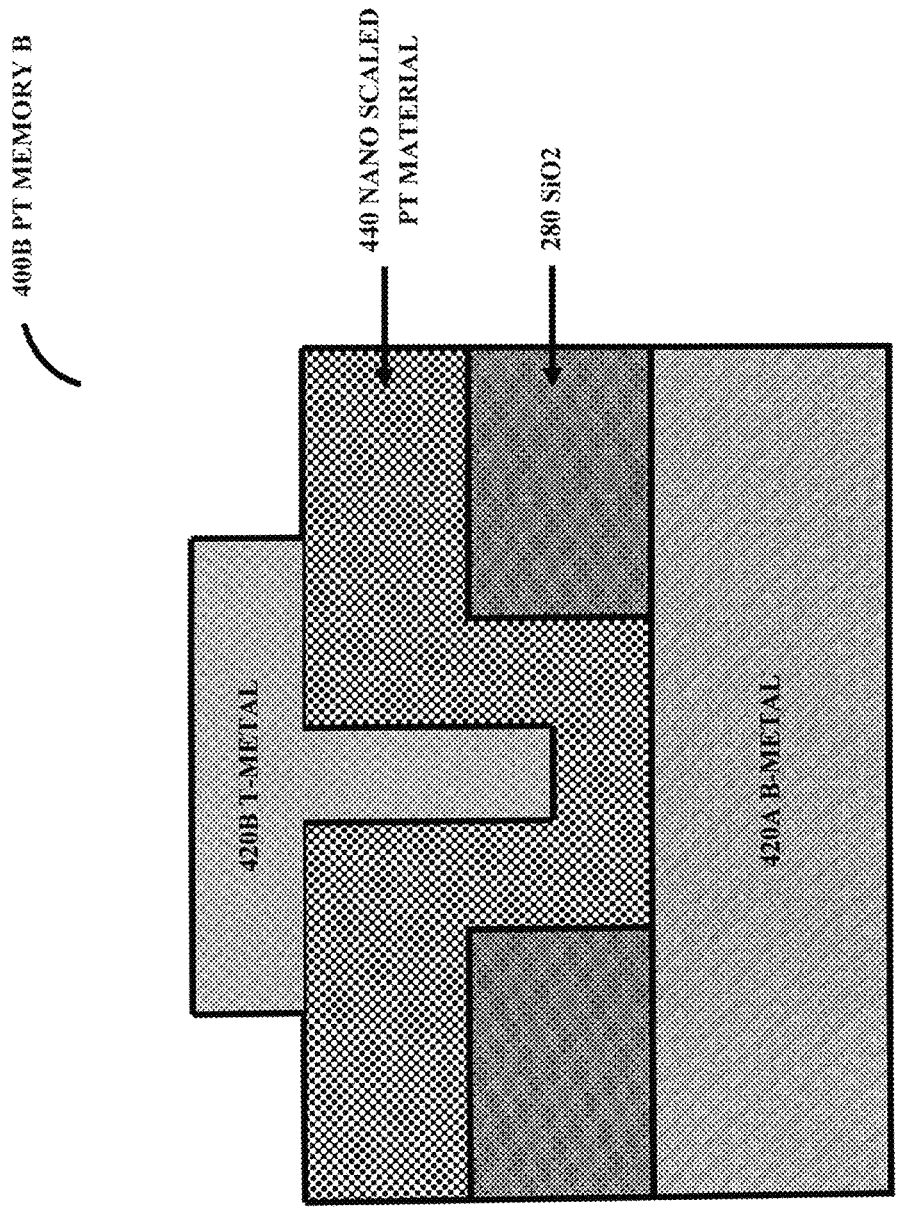
FIG. 6 illustrates another embodiment of an electronic memory device.

FIG. 6 illustrates another embodiment of a cross-sectional design of a cell of 440B, an electronic memory device based on nanoscaled phase transition material. In FIG. 6 bottom metal is denoted by 420A, silicon dioxide is denoted by 280, nanoscaled phase transition material is denoted by 440 and top metal is denoted by 420B.

Figure 7:
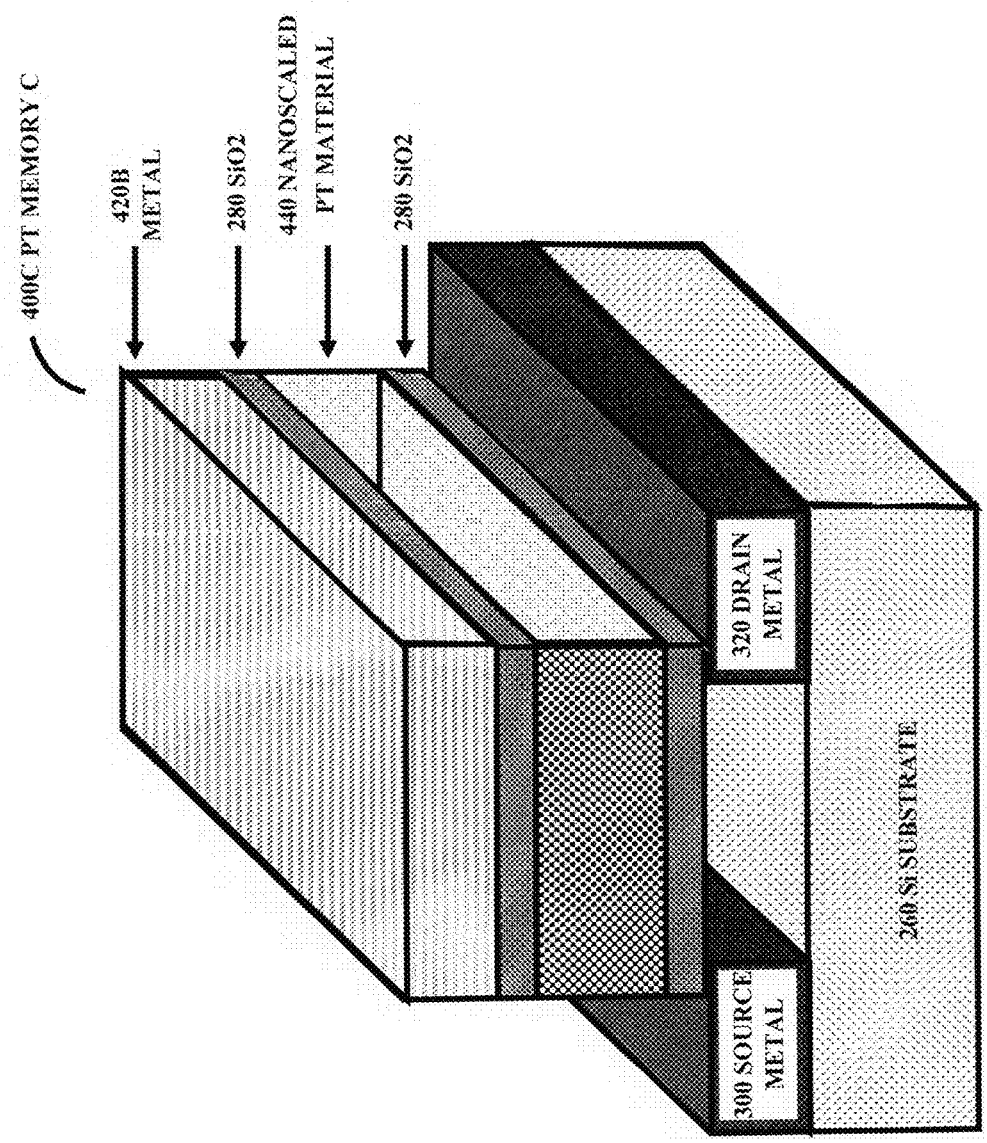
FIG. 7 illustrates another embodiment of an electronic memory device.

FIG. 7 illustrates another embodiment of a cross-sectional design of a cell of 400C, an electronic memory based on nanoscaled phase transition material. In FIG. 7 silicon substrate is denoted by 260, source metal is denoted by 300, drain metal is denoted by 320, a silicon dioxide is denoted by 280, nanoscaled phase transition material is denoted by 440, another silicon dioxide is denoted by 280 and top metal is denoted by 420B.

Figure 8:
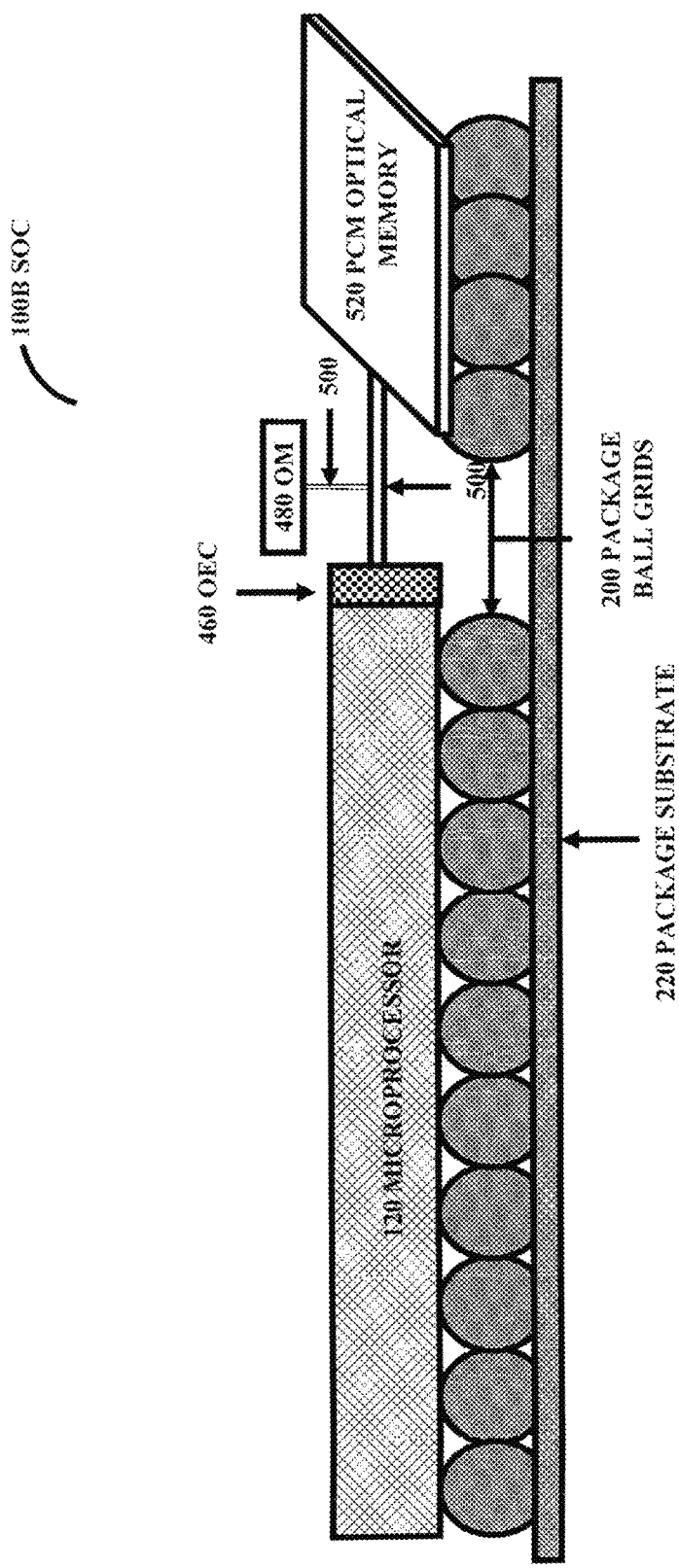
FIG. 8 illustrates an embodiment of a second system on chip-a microprocessor optically connecting with an optical memory device.

FIG. 8 illustrates an embodiment of 100B, a second system on chip-120, the microprocessor optically coupled with 520, an optical memory device. In FIG. 8 the microprocessor is denoted by 120, which is electrically connected to the package substrate 220 with the package ball grids 200. 120, the microprocessor is electro-optically connected by 460, an optical to electrical converter (OEC) device. An optical module (OM) is denoted by 480, which provides many wavelengths of controlled intensities. 460, the optical to electrical converter device, 480, the optical module and 520, the optical memory device is optically connected by 500, a waveguide. Details of 520, the optical memory device are illustrated in FIG. 10.

Figure 9:
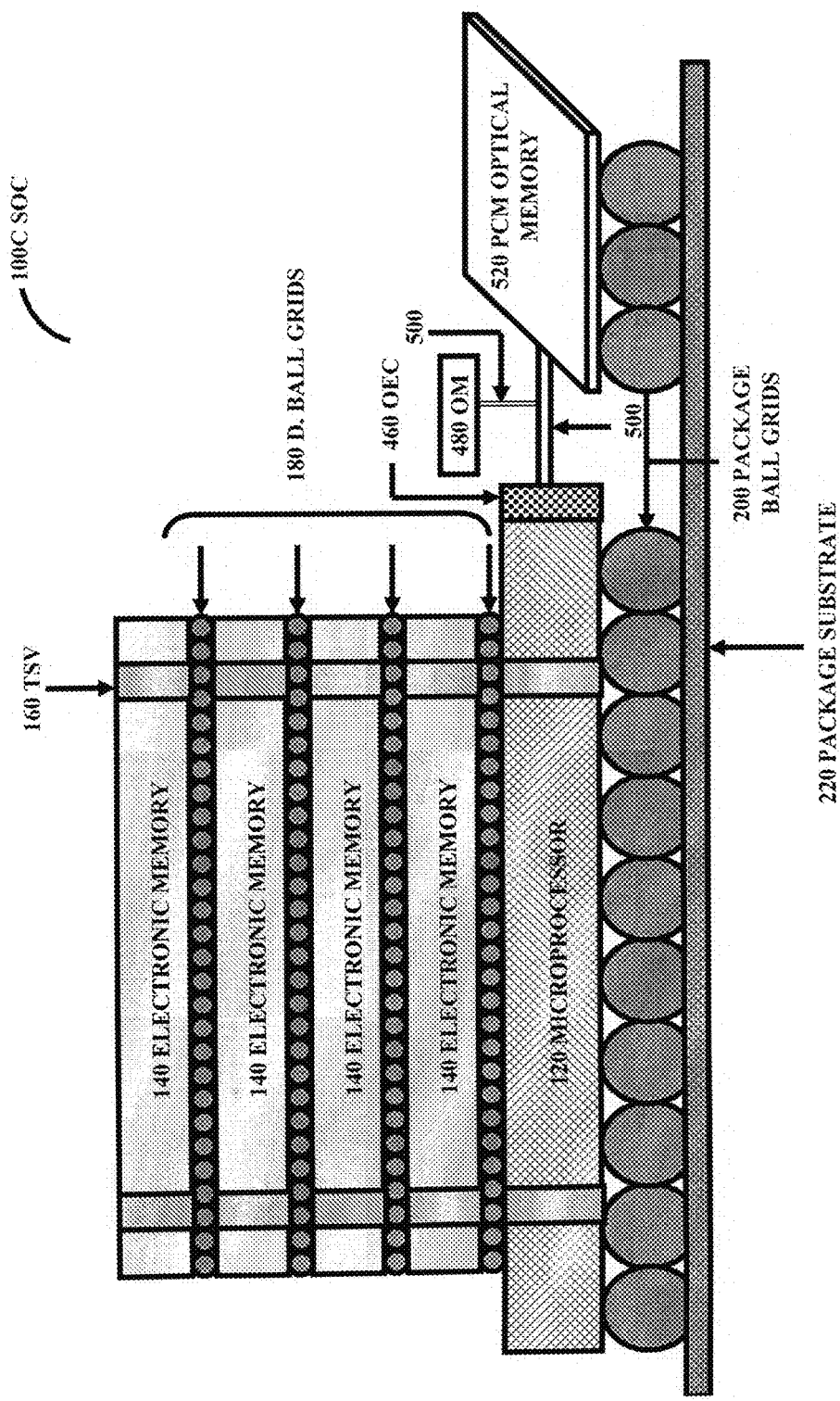
FIG. 9 illustrates another embodiment of a third system on chip-a microprocessor optically connecting with an optical memory device and also electrically connecting with electronic memory devices.

FIG. 9 illustrates an embodiment of 100C, a third system on chip-120, the microprocessor optically coupled with 520, the phase change optical memory device. FIG. 9 is similar to FIG. 8 with exception that 120, the microprocessor is additionally electrically connected with 140, the electronic memory devices. 120, the microprocessor, which is electrically connected with 140, the electronic memory device(s) through 160, the metallized semiconductor via hole. Device ball grids (for electrically connecting 140, the electronic memory devices with 120, the microprocessor) is denoted by 180. Package ball grids (for electrically connecting 120, the microprocessor to 220, the package substrate) is denoted by 200.

It should be noted that 120, the microprocessor can comprise any type of transistors including, but not limited to field effect transistors. Furthermore, 120, the microprocessor can comprise digital unit and/or neural networks based unit, wherein the neural networks based unit can comprise memristors (e.g., phase change material or phase transition material based memristors).

Figure 10:
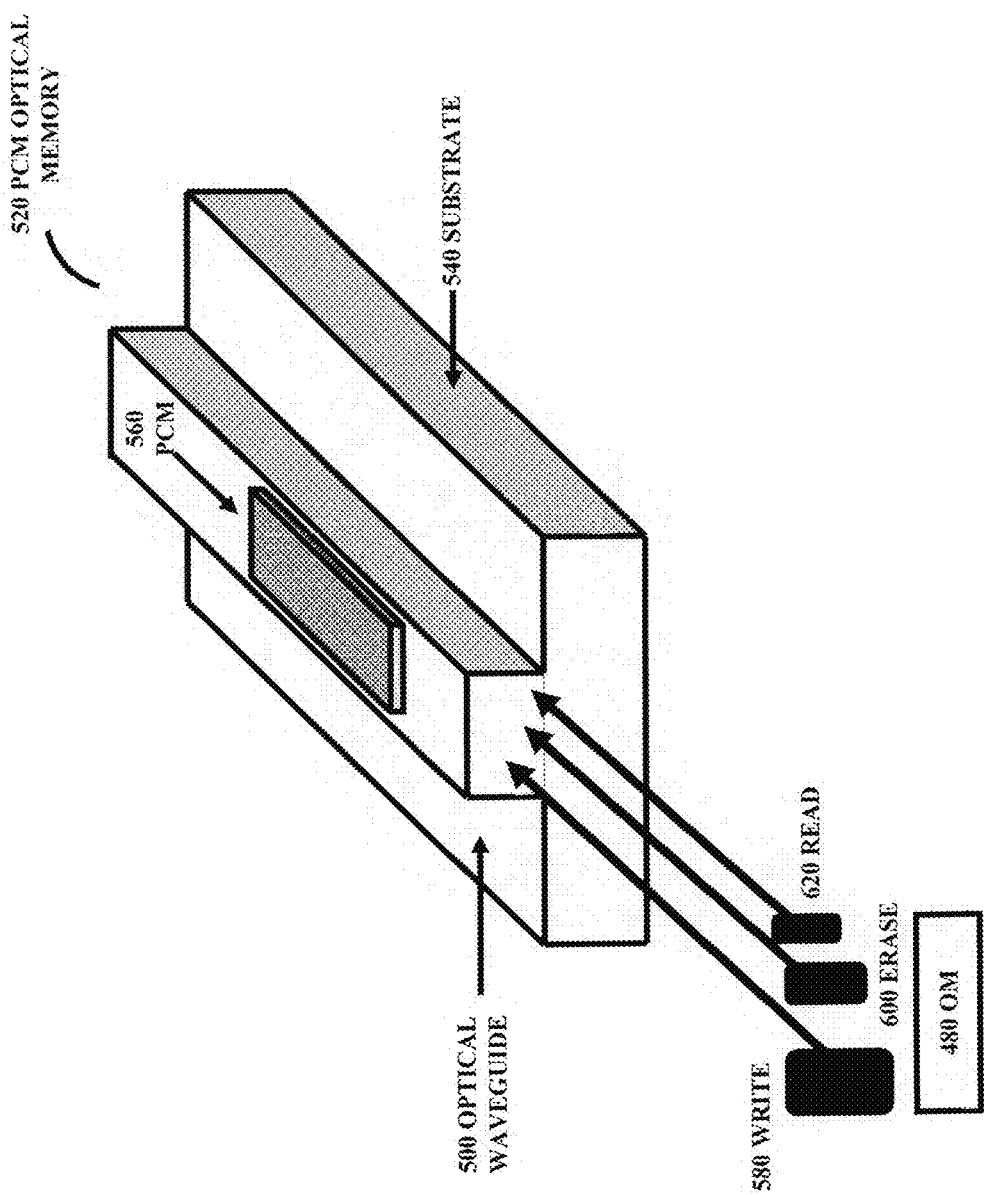
FIG. 10 illustrates an embodiment of an optical memory device.

FIG. 10 illustrates an embodiment of 520, an optical memory device. In FIG. 10 500, the optical waveguide is fabricated on 540, a substrate (e.g., silicon on insulator (SOI) substrate). 500, the optical waveguide has 560, a patch of a phase change material. 560, the patch of a phase change material is activated for writing, reading and erasing by various wavelengths of controlled intensities from 480, the optical module.

Write wavelength (first wavelength) of a controlled first intensity is denoted by 580, erase wavelength (second wavelength) of a controlled second intensity is denoted by 600 and read wavelength (third wavelength) of a controlled third intensity is denoted by 620.

In the above disclosed specifications "/" has been used to indicate an "or".

Any example in the preferred best mode embodiments is by way of an example only and not by way of any limitation.

The above disclosed specifications are the preferred best mode embodiments of the present invention. The specifications are not intended to be limiting only to the preferred best mode embodiments of the present invention. Numerous variations and/or modifications are possible within the scope of the present invention. Accordingly, the disclosed preferred best mode embodiments are to be construed as illustrative only. The inventors of the present invention are not required to describe each and every conceivable and possible future embodiment(s) in the preferred best mode embodiments of the present invention.

A claim of this invention covers not only the literal elements in the claim, but also the equivalents of those elements. Thus, the scope and spirit of this invention shall be defined by the claims and the equivalents of the claims only. The exclusive use of all variations and/or modifications within the scope of the claims is reserved. Unless a claim term is specifically defined in the preferred best mode embodiments, then a claim term has an ordinary meaning, as understood by a person with an ordinary skill in the art, at the time of the present invention.

We claim:

1. A system on chip comprising: a microprocessor, wherein the microprocessor is optically connected with an optical memory device, wherein the optical memory device comprises: a phase change material, wherein the microprocessor is further optically connected with the optical memory device by an optical device, an optical to electronic converter device and an optical waveguide, wherein the optical device comprises: a light source of one or more wavelengths, or light sources of one or more wavelengths, wherein the optical device is configured to provide one or more wavelengths of controlled optical intensities.

2. The phase change material according to claim 1, further comprises: germanium-antimony-tellurium (GeSbTe).

3. The system on chip according to claim 1, further comprises the optical memory device, wherein the optical memory device is activated by a first wavelength of a first intensity for writing, wherein the optical memory device is activated by a second wavelength of a second intensity for erasing, wherein the optical memory device is activated by a third wavelength of a third intensity for reading.

4. The system on chip according to claim 1, further comprises: an electronic memory device.

5. The electronic memory device according to claim 4, further comprises: a phase transition material.

6. The electronic memory device according to claim 5, further comprises: a phase transition material, which is fabricated to a size less than 1000 nanometers.

7. A system on chip comprising: a microprocessor, wherein the microprocessor is optically connected with an optical memory device, wherein the microprocessor comprises: hybrid carbon nanotube and phase transition based field effect transistors,
    wherein the microprocessor is further optically connected with the optical memory device by an optical device, an optical to electronic converter device and an optical waveguide,
        wherein the optical device comprises: a light source of one or more wavelengths, or light sources of one or more wavelengths,
        wherein the optical device is configured to provide one or more wavelengths of controlled optical intensities,
    wherein the carbon nanotube is metallurgically connected/welded to a source metal or a drain metal.

8. The optical memory device according to claim 7, further comprises: a phase change material.

9. The optical memory device according to claim 8, further comprises: germanium-antimony-tellurium (GeSbTe).

10. The system on chip according to claim 7, further comprises: the optical memory device, wherein the optical memory device is activated by a first wavelength of a first intensity for writing, wherein the optical memory device is activated by a second wavelength of a second intensity for erasing, wherein the optical memory device is activated by a third wavelength of a third intensity for reading.

11. The system on chip according to claim 7, further comprises: an electronic memory device.

12. The electronic memory device according to claim 11, further comprises: a phase transition material.

13. The electronic memory device according to claim 12, further comprises: a phase transition material, which is fabricated to a size less than 1000 nanometers.

14. A system on chip comprising: a microprocessor, wherein the microprocessor is optically connected with an optical memory device, wherein the microprocessor comprises: carbon nanotube based field effect transistors or phase transition based field effect transistors,
    wherein the microprocessor is further optically connected with the optical memory device by an optical device, an optical to electronic converter device and an optical waveguide,
        wherein the optical device comprises: a light source of one or more wavelengths, or light sources of one or more wavelengths,
        wherein the optical device is configured to provide one or more wavelengths of controlled optical intensities,
    wherein the carbon nanotube is metallurgically connected/welded to a source metal or a drain metal.

15. The optical memory device according to claim 14, further comprises: a phase change material.

16. The optical memory device according to claim 15, further comprises: germanium-antimony-tellurium (GeSbTe).

17. The system on chip according to claim 14, further comprises: the optical memory device, wherein the optical memory device is activated by a first wavelength of a first intensity for writing, wherein the optical memory device is activated by a second wavelength of a second intensity for erasing, wherein the optical memory device is activated by a third wavelength of a third intensity for reading.

18. The system on chip according to claim 14, further comprises: an electronic memory device.

19. The electronic memory device according to claim 18, further comprises: a phase transition material.

20. The electronic memory device according to claim 19, further comprises: a phase transition material, which is fabricated to a size less than 1000 nanometers.

* * * * *